(12) United States Patent
Goeke et al.

(10) Patent No.: US 7,923,985 B2
(45) Date of Patent: Apr. 12, 2011

(54) ACTIVE AUTORANGING CURRENT SENSING CIRCUIT

(75) Inventors: Wayne C. Goeke, Hudson, OH (US); Martin J. Rice, Sagamore Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 201 days.

(21) Appl. No.: 12/113,640

(22) Filed: May 1, 2008

(65) Prior Publication Data

US 2009/0273338 A1 Nov. 5, 2009

(51) Int. Cl.
*G01R 15/00* (2006.01)
(52) U.S. Cl. ........................................................ 324/115
(58) Field of Classification Search .................. None
See application file for complete search history.

(56) References Cited

U.S. PATENT DOCUMENTS

| | | | | |
|---|---|---|---|---|
| 2,981,107 A | * | 4/1961 | Anderson | 324/73.1 |
| 3,539,936 A | * | 11/1970 | McGhee | 330/279 |
| 4,105,967 A | * | 8/1978 | Macemon | 324/115 |
| 5,144,154 A | * | 9/1992 | Banaska | 324/115 |
| 5,994,947 A | * | 11/1999 | Sobolewski et al. | 327/403 |
| 6,262,670 B1 | | 7/2001 | Ballou | |
| 7,098,648 B2 | * | 8/2006 | Krieger et al. | 324/115 |
| 7,202,676 B2 | * | 4/2007 | Banaska et al. | 324/713 |
| 7,276,893 B2 | | 10/2007 | Banaska et al. | |
| 2006/0192547 A1 | * | 8/2006 | Banaska et al. | 324/115 |
| 2006/0192571 A1 | * | 8/2006 | Banaska et al. | 324/713 |

* cited by examiner

*Primary Examiner* — Jermele M Hollington
(74) *Attorney, Agent, or Firm* — Pearne & Gordon LLP

(57) ABSTRACT

A range-changing circuit for a measurement device having a desirable range includes an array of graduated impedances. And amplifier supplies an electrical voltage to at least one of the impedances of the array. A voltage sensing and limiting switch is provided in a feedback path of the amplifier. The switch limits said electrical voltage supplied to said at least one of the impedances in response to a sensed voltage that is sensed by the switch. An electrical voltage in the desirable range is developed across a different one of the impedances of the array based on an operation of the switch.

13 Claims, 3 Drawing Sheets

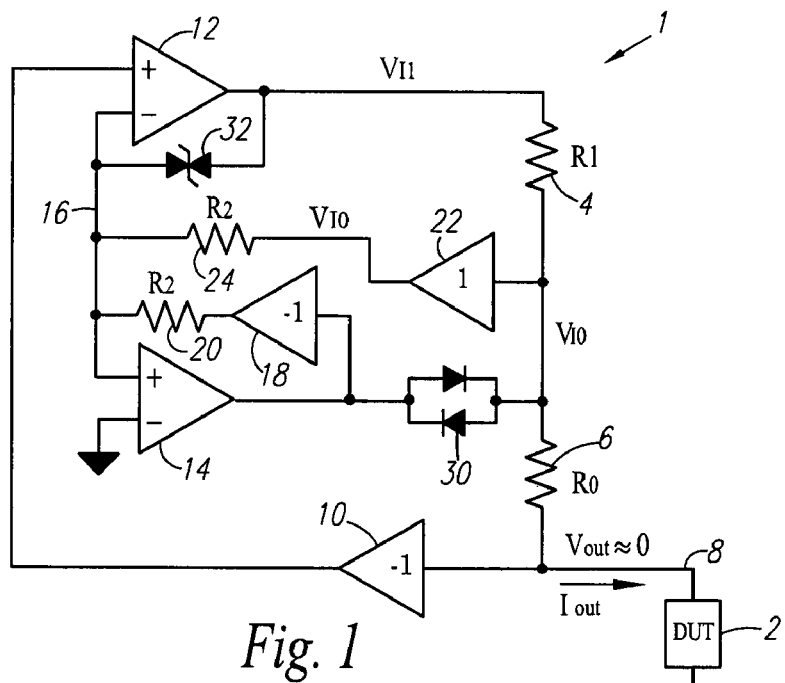
Fig. 1
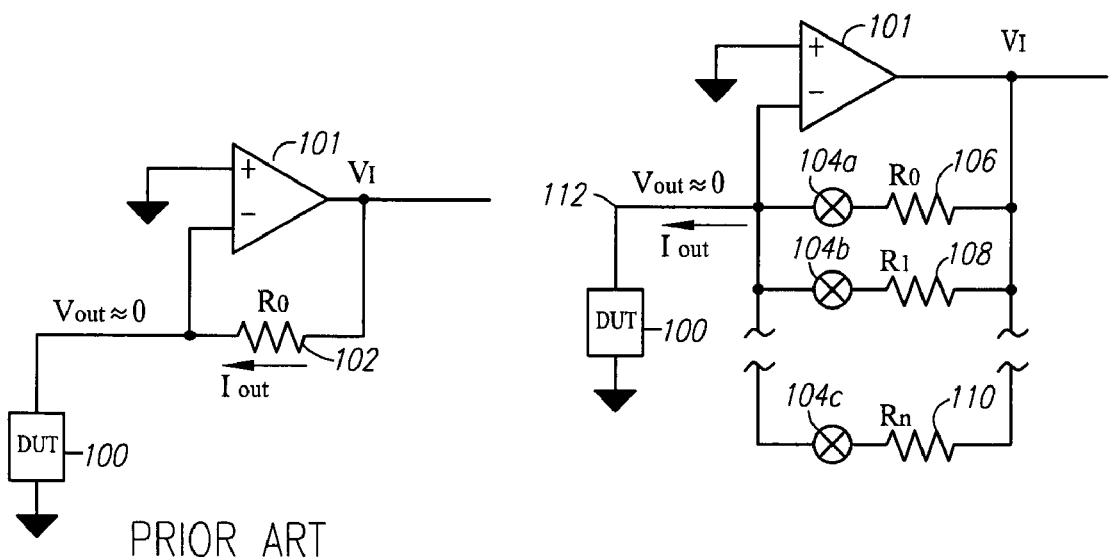
PRIOR ART
Fig. 4
PRIOR ART
Fig. 5

ACTIVE AUTORANGING CURRENT SENSING CIRCUIT

BACKGROUND OF THE INVENTION

1. Field of the Invention

The present invention relates to electrical measurement equipment and, in particular, to automatic range-changing circuits for use in measuring electrical current.

2. Description of Related Art

A conventional method for determining electrical current, the so-called feedback method, is shown in FIG. 4. A load device, such as a device under test (DUT) 100, draws current $I_{out}$ from the output of an amplifier 101. The current $I_{out}$ develops a voltage $V_I$ across a resistor 102. The current $I_{out}$ is proportional to the voltage $V_I$ and can be determined based on a measurement of $V_I$ across the resistor 102.

The saturation voltage of the amplifier 101 limits the level of current $I_{out}$ that can accurately be measured using the circuit of FIG. 4. As voltage $V_I$ rises due to increased current $I_{out}$ draw by the DUT 100, the saturation voltage of the amplifier 101 may be approached. Adding additional resistors that can be selectively switched into and out of the feedback circuit of the amplifier 101 will provide ranges of current that can be measured while maintaining the voltage $V_I$ within a desirable voltage range below the saturation voltage of the amplifier 101. Such a circuit is shown in FIG. 5. A plurality of switches 104a, 104b, 104c respectively switch resistors $R_0$ 106, $R_1$ 108, and $R_n$ 110 into and out of the amplifier's 101 feedback circuit. Each resistor 106, 108, 110 is sized to provide a voltage measurement within the desirable range, whatever that may be, for a particular range of current $I_{out}$. The switches 104a, 104b, 104c are selectively actuated to switch the resistors 106, 108, 110 into and out of the feedback circuit, based on the level of the current $I_{out}$. Typically, only one resistor 106, 108, 110 is switched into the feedback circuit at a time. If the current $I_{out}$ increases, a smaller resistor can be switched into the feedback circuit and a larger resistor switched out, to keep the voltage $V_I$ within the desirable range. However, the amplifier 101 may saturate before the smaller resistor is switched into the feedback circuit, which is not desirable. If the current $I_{out}$ decreases, a larger resistor can be switched into the feedback circuit and a smaller resistor out. Switching in a larger resistor requires a sudden change in the voltage $V_I$ at the output of the amplifier 101 and results in an undesirable glitch at an output node 112 ($V_{out}$) of the circuit.

BRIEF SUMMARY OF THE INVENTION

A range-changing circuit for a measurement device having a desirable range includes an array of graduated impedances. A first amplifier supplies an electrical voltage to at least one of the impedances of the array. A voltage sensing and limiting switch is provided in a feedback path of the first amplifier. The switch limits said electrical voltage supplied to said at least one of the impedances in response to a sensed voltage that is sensed by the switch. An electrical voltage in the desirable range is developed across a different one of the impedances of the array based on an operation of the switch. A second amplifier, based on the operation of the switch, supplies electrical current to said different one of the impedances when the electrical voltage in the desirable range is developed across said different one of the impedances.

A measurement system for performing measurements on a device under test includes a source-measure unit for selectively supplying a voltage signal to the device under test in a first operating mode and a current signal to the device under test in a second operating mode. The measurement system includes an automatically range-changing current-to-voltage converter circuit having a desirable voltage range. The converter circuit has an array of graduated impedances, a first amplifier for supplying an electrical voltage to at least one of the impedances of the array, a second amplifier, and a voltage sensing and limiting switch in a feedback path of the first amplifier. The switch limits said electrical voltage supplied to said at least one of the impedances in response to a sensed voltage that is sensed by the switch. An electrical voltage in the desirable voltage range is developed across a different one of the impedances of the array based on an operation of the switch. The second amplifier, based on the operation of the switch, supplies electrical current to said different one of the impedances when the electrical voltage in the desirable voltage range is developed across said different one of the impedances.

A range-changing circuit for a feedback-type current measurement device having a desirable range includes an array of impedance elements in serial relationship. The impedance value of the impedance elements progressively ranges from an upstream high value to a downstream low value. The circuit includes a voltage-sensing driver for each of at least two of the impedance elements. The upstream driver drives current through its respective impedance and any downstream impedances unless a voltage limit is sensed by the driver. When the voltage limit is sensed, the next downstream driver switches from an off mode and drives current through its respective impedance and any downstream impedances, the circuit thereby providing said desirable range.

BRIEF DESCRIPTION OF THE DRAWINGS

FIG. 1 is a schematic diagram of an example autoranging circuit;

FIG. 4 is a schematic diagram of a prior art device; and

FIG. 5 is a schematic diagram of a prior art device.

DETAILED DESCRIPTION OF THE INVENTION

Figure 2:
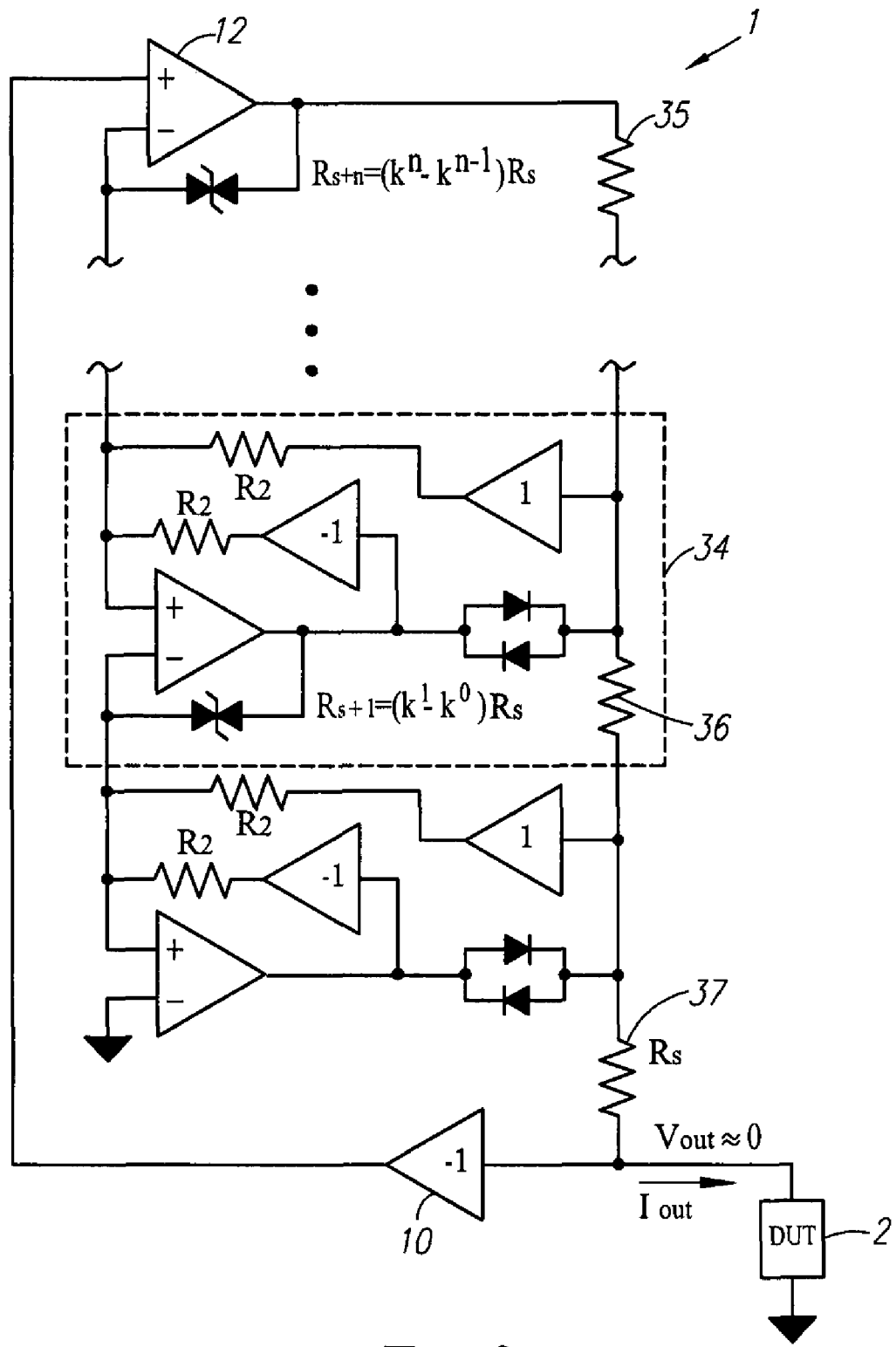
FIG. 2 is a schematic diagram of an example autoranging circuit.

The present invention relates to electrical measurement equipment and, in particular, to automatic range-changing circuits for use in determining various levels of electrical current. The present invention will now be described with reference to the drawings, wherein like reference numerals are used to refer to like elements throughout. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

A two-range feedback-type autoranging circuit 1 for converting current $I_{out}$ drawn by a DUT 2 into a voltage within a desirable range is shown in FIG. 1. Two resistors, $R_1$ 4 and $R_0$ 6 form an array of impedances and are in serial relationship. In an embodiment, the values of the resistors are determined by the equation: $R_1 = (k^1 - 1) R_0$, where k is the ratio of the current ranges to be measured with each resistor 4, 6. Resistor $R_1$ 4 is larger than resistor $R_0$ 6, and provides a low current range. The voltage that is developed across resistor $R_1$ 4, or the voltage $V_{I1}$ that is developed across both resistors $R_1$ 4 and $R_0$ 6, can be measured to determine the current in the DUT 2 for current levels in the low range. Resistor $R_0$ 6 provides the high current range, and the voltage $V_{I0}$ that is developed across resistor $R_0$ 6 can be measured to determine the current in the DUT 2 for current levels in the high range.

The current $I_{out}$ through the DUT 2 flows from an output node 8 of the circuit 1. The voltage $V_{out}$ at the output node 8 is considered to be approximately 0 volts.

The autoranging operation that occurs when the current $I_{out}$ increases from the low range to the high range will now be described. Increasing current draw by the DUT 2 lowers the voltage $V_{out}$ at the output node 8. An inverting amplifier 10 provides an inverted version of $V_{out}$ to the non-inverting input of an amplifier 12. As $V_{out}$ decreases, the output of the inverting amplifier 10 increases. As the output of the inverting amplifier 10 increases, the voltage $V_{I1}$ at the output of amplifier 12 increases, which forces increased current through resistor $R_1$ 4 and resistor $R_0$ 6. The increased current through $R_1$ and $R_0$ drives the voltage $V_{out}$ at the output node 8 back to approximately 0 volts. The voltage $V_{I0}$ also increases, but only at 1/k as fast as the voltage $V_{I1}$.

Another amplifier 14 has a non-inverting input that is connected to the inverting input of amplifier 12 at a summing node 16. An inverting input of amplifier 14 is connected to ground. (As used herein, the term "ground" refers to a reference potential for a circuit, which may or may not be referenced to the electrical potential of the Earth). When the circuit 1 operates in the low current range, the summing node 16 is a virtual ground and is controlled by feedback from the output of amplifier 14 through an inverting amplifier 18 and a resistor $R_2$ 20.

As stated above, the voltage level of both $V_{I1}$ and $V_{I0}$ increase when $V_{out}$ decreases from increased current draw by the DUT 2. When $V_{I0}$ increases, a buffer 22 pushes current into the summing node 16 through a resistor $R_2$ 24. Inverting amplifier 18 pulls an equal current from the summing node 16 through the resistor $R_2$ 20. It is to be appreciated that the balanced current into and out of the summing node 16 results in the output of the amplifier 14 having a voltage level equal to $V_{I0}$. Therefore, a diode pair 30 that is connected to the output of the amplifier 14 is guarded, because a potential difference across the diode pair has been eliminated.

A zener diode pair 32 is located in the feedback path of amplifier 12, between its output and its inverting input. As the current $I_{out}$ continues to increase, the voltage $V_{I1}$ at the output of the amplifier 12 increases until reaching the clamp voltage of the zener diode pair 32. The zener diode pair 32 limits the voltage $V_{I1}$ that is supplied to the resistor $R_1$ by sensing the voltage $V_{I1}$ and switching ON when $V_{I1}$ reaches the zener clamp voltage. When $V_{I1}$ equals the clamp voltage and the zener diode pair 32 switches ON, the amplifier 12 takes control of the summing node 16 and forces it to a voltage level equal to the output of the inverting amplifier 10. The amplifier 14 will increase its output until it turns on the diode pair 30 and starts to supply current to the DUT 2 through resistor $R_0$ 6, thereby controlling the voltage $V_{out}$ at the output node 8. When the amplifier 12 takes control of the summing node 16 and the amplifier 14 supplies current to the DUT 2, the circuit 1 has performed the autoranging operation, switching from the low range to the high range. The voltage $V_{I0}$ will now be in the desirable range and can be measured instead of $V_{I1}$ to determine the current in the DUT 2. The autoranging operation performed by the circuit 1 makes the occurrence of a voltage glitch at the output node 8 unlikely.

The zener diode pair 32 is one example of a voltage sensing and limiting switch. Other types of voltage sensing and limiting switches could be provided in the feedback path of the amplifier 12, such as a voltage-controlled transistor or solid-state relay.

It is to be appreciated that the autoranging circuit 1 provides voltage-sensing drivers for each of resistors $R_1$ 4 and $R_0$ 6. The driver for resistor $R_1$ 4 drives current through resistor $R_1$ 4, downstream resistor $R_0$ 6, and the DUT 2, unless a voltage limit is sensed by the driver. When the voltage limit is sensed by the driver for resistor $R_1$ 4, the circuit 1 performs its autoranging operation and the driver for resistor $R_0$ switches from an "OFF mode" in which it does not supply current to resistor $R_0$ 6 and the DUT 2 to an "ON mode." When the driver for resistor $R_0$ switches to its ON mode, it drives current through $R_0$ 6 and the DUT 2. The driver for resistor $R_0$ 6 is guarded when in the OFF mode because a potential difference across the diode pair 30 has been eliminated.

As discussed above, the circuit 1 shown in FIG. 1 provides for two ranges of current measurement. Turning to FIG. 2, it is to be appreciated that additional ranges of current measurement can be provided by replicating the subcircuit 34 within the autoranging circuit 1 as desired. The circuit of FIG. 2 includes an array of graduated impedances, for example graduated resistors 35, 36, 37, whose values may be determined by an equation, such as: $R_{s+n}=(k^n-k^{n-1})R_s$, where k is the ratio of the current ranges to be measured with each resistor 35, 36, 37. Resistor 35 is the largest resistor in the array and is located upstream of resistors 36 and 37 with respect to current flow through the array and the DUT 2. Resistor 37 is the smallest resistor in the array and is located downstream of resistors 35 and 36. The voltages developed within the array can be monitored to determine the current in the DUT 2, and the array will maintain a voltage within the desirable range by autoranging. The high current range is provided by resistor 37 and the low current range is provided by resistor 35. An intermediate current range is provided by resistor 36. Additional intermediate current ranges can be provided by replicating the subcircuit 34 within the autoranging circuit 1.

Figure 3:
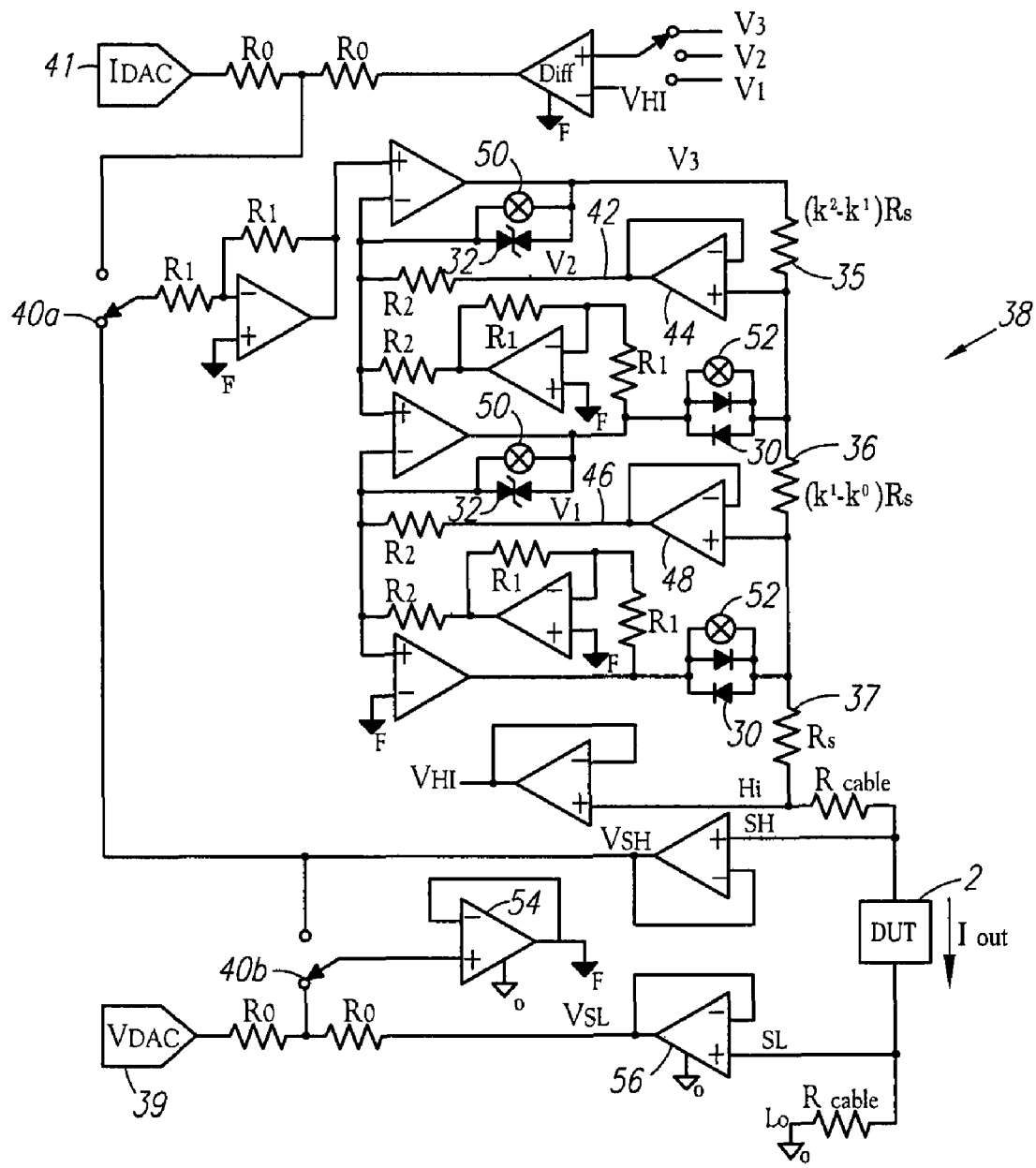
FIG. 3 is a schematic diagram of an example source-measure unit having an autoranging circuit.

Referring to FIG. 3, an example source-measure unit (SMU) 38 is illustrated. The SMU 38 supplies a voltage signal to the DUT 2 in a first operating mode and a current signal to the DUT 2 in a second operating mode. The operational mode of the SMU 38 is determined by the state of two single pole double throw (form C) switches 40a, 40b. When the form C switches 40a, 40b are in the downward position as shown in FIG. 3, the SMU 38 is in the first operating mode and forces a voltage signal on the DUT 2 via a voltage source 39. When the form C switches 40a, 40b are in the upward position, the SMU 38 is in the second operating mode and forces a current signal through the DUT 2 via a current source 41.

The SMU 38, as shown, includes a three-range autoranging circuit for converting current to voltage when in the first operating mode. A three-range auto ranging circuit is one example of an autoranging circuit for use by an SMU 38. It is to be appreciated that the auto-ranging circuit could provide any number of measurement ranges via additional range subcircuits.

When the SMU 38 is in the first operating mode, the current $I_{out}$ drawn by the DUT 2 can be determined by measuring a voltage $V_1$, $V_2$, or $V_3$ developed within the array of resistors 35, 36, 37. The voltage $V_1$, $V_2$, or $V_3$ to be measured depends on the range in which $I_{out}$ falls (e.g., high, intermediate, or low). The voltage $V_1$ will be in the desirable range when $I_{out}$ is in the high range. The voltage $V_2$ will be in the desirable range when $I_{out}$ is in the intermediate range. The voltage $V_3$ will be in the desirable range when $I_{out}$ is in the low range. It is to be appreciated that the voltage measurements need not be made directly at the resistors 35, 36, 37, but can be made at nodes having a virtual version of the voltage at a resistor, such as at node 42 (output of buffer 44) and at node 46 (output of buffer 48).

When the SMU 38 is in the second operating mode and sourcing a current signal through the DUT 2, autoranging is not desirable. Switches 50 are provided, which are electrically in parallel with the zener diode pairs 32, to short out the zener diode pairs 32 when the SMU 38 is in the second operating mode. The switches 50 allow for a fixed range operation of the SMU 38 when sourcing current. Switches 52 are also provided across the diode pairs 30 so that the current source 41 of the SMU 38 does not have to push current through the diodes 30 to control the current. The ability to short out the zener diode pairs 32 and the diodes 30 allows the current source 41 to maintain a constant bandwidth.

In an embodiment, all active circuit elements of the SMU 38 are powered from $F_{gnd}$ power supplies except for buffers 54 and 56, which are powered from $O_{gnd}$ power supplies.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A range-changing circuit for a measurement device having a desirable range, said range-changing circuit comprising:
   an array of graduated impedances;
   a first amplifier, wherein the first amplifier supplies an electrical voltage to at least one of the impedances of the array;
   a voltage sensing and limiting switch in a feedback path of the first amplifier; and
   a second amplifier,
   the switch being operable to limit said electrical voltage supplied to said at least one of the impedances in response to a sensed voltage that is sensed by the switch and to develop an electrical voltage in the desirable range across a different one of the impedances of the array based on an operation of the switch, and
   wherein the second amplifier, based on said operation of the switch, supplies electrical current to said different one of the impedances when the electrical voltage in the desirable range is developed across said different one of the impedances.

2. A range-changing circuit according to claim 1, wherein an inverting input of the first amplifier and a non-inverting input of the second amplifier are connected together at a summing node.

3. A range-changing circuit according to claim 1, wherein the switch includes a zener diode.

4. A range-changing circuit according to claim 3, further comprising another zener diode, wherein the another zener diode is located in the feedback path of the first amplifier.

5. A range-changing circuit according to claim 3, further comprising another switch, wherein the another switch is connected electrically in parallel with the voltage sensing and limiting switch.

6. A measurement system for performing measurements on a device under test, the system comprising:
   a source-measure unit for selectively supplying a voltage signal to the device under test in a first operating mode and a current signal to the device under test in a second operating mode; and
   an automatically range-changing current-to-voltage converter circuit having a desirable voltage range, said converter circuit including:
   an array of graduated impedances;
   a first amplifier, wherein the first amplifier supplies an electrical voltage to at least one of the impedances of the array; and
   a voltage sensing and limiting switch in a feedback path of the first amplifier; and
   a second amplifier,
   the switch being operable to limit said electrical voltage supplied to said at least one of the impedances in response to a sensed voltage that is sensed by the switch and to develop an electrical voltage in the desirable voltage range across a different one of the impedances of the array based on an operation of the switch, and
   wherein the second amplifier, based on said operation of the switch, supplies electrical current to said different one of the impedances when the electrical voltage in the desirable voltage range is developed across said different one of the impedances.

7. A measurement system according to claim 6, wherein the measurement system is operable to produce an electrical current in the device under test proportional to the electrical voltage in the desirable voltage range that is developed across said different one of the impedances.

8. A measurement system according to claim 6, wherein an inverting input of the first amplifier and a non-inverting input of the second amplifier are connected together at a summing node.

9. A measurement system according to claim 6, wherein the switch includes a zener diode.

10. A measurement system according to claim 6, further comprising another switch, wherein the another switch is connected electrically in parallel with the voltage sensing and limiting switch.

11. A measurement system according to claim 10, wherein the another switch has a conducting mode and a non-conducting mode, and wherein the another switch is in the conducting mode while the source-measure unit supplies the current signal to the device under test in the second operating mode.

12. A range-changing circuit for a feedback-type current measurement device having a desirable range, comprising:
   an array of impedance elements in serial relationship, the impedance value of said impedance elements progressively ranging from an upstream high value to a downstream low value; and
   a voltage-sensing driver for each of an upstream and a downstream impedance element in said array, wherein the voltage-sensing driver for the upstream impedance element drives current through the upstream impedance element and any downstream impedance elements unless a voltage limit is sensed by the voltage sensing driver for the upstream impedance element and when the voltage limit is sensed, the voltage-sensing driver for the downstream impedance element switches from an off mode and drives current through the downstream impedance element and any additional downstream impedances, the circuit thereby providing said desirable range.

13. A circuit according to claim 12, wherein at least one of the voltage-sensing drivers when in an off mode is guarded by eliminating a potential difference between switching elements.

* * * * *